United States Patent [19]
Cathey et al.

[11] Patent Number: 5,300,463
[45] Date of Patent: Apr. 5, 1994

[54] METHOD OF SELECTIVELY ETCHING SILICON DIOXIDE DIELECTRIC LAYERS ON SEMICONDUCTOR WAFERS

[75] Inventors: David A. Cathey; J. Brett Rolfson, both of Boise, Id.

[73] Assignee: Micron Technology, Inc., Boise, Id.

[21] Appl. No.: 847,368

[22] Filed: Mar. 6, 1992

[51] Int. Cl.$^5$ ............... H01L 21/00; H01L 21/02; H01L 21/465
[52] U.S. Cl. ............................ 437/228; 437/235; 437/238; 437/240; 437/236
[58] Field of Search ............... 437/228, 235, 236, 238, 437/240; 156/646

[56] References Cited

U.S. PATENT DOCUMENTS

| | | | |
|---|---|---|---|
| 3,751,314 | 8/1973 | Rankel | 437/236 |
| 4,052,253 | 10/1977 | Kingzett | 156/657 |
| 4,211,601 | 7/1980 | Mogab | 156/646 |

OTHER PUBLICATIONS

Wolf, Silicon Processing for the VLSI Era, vol. 1, Lattice Press, 1986, pp. 532-534.

*Primary Examiner*—Brian E. Hearn
*Assistant Examiner*—B. Everhart
*Attorney, Agent, or Firm*—Wells, St. John, Roberts, Gregory & Matkin

[57] ABSTRACT

A method of utilizing and etching $SiO_2$ in the processing of semiconductor wafers comprises: a) providing a layer of undoped $SiO_2$ atop a wafer; b) providing a layer of doped $SiO_2$ atop the layer of undoped $SiO_2$; and c) wet etching the layer of doped $SiO_2$ selectively relative to the undoped layer of $SiO_2$ utilizing an acid solution, the acid solution comprising a mixture of at least two different mineral acids provided in a selected ratio relative to one another, one of the mineral acids being HF. The preferred volumetric ratio of other mineral acids in the acid solution to HF in the acid solution is from 20:1 to 110:1, with a ratio of from 45:1 to 65:1 being most preferred. Example acids to be combined with the HF include $H_2SO_4$, $HCl$, $HNO_3$, $H_3PO_4$, $HBr$, $HI$, $HClO_4$, and $HIO_4$, or mixtures thereof.

20 Claims, 2 Drawing Sheets

METHOD OF SELECTIVELY ETCHING SILICON DIOXIDE DIELECTRIC LAYERS ON SEMICONDUCTOR WAFERS

TECHNICAL FIELD

This invention relates generally to methods of utilizing and etching $SiO_2$ in the processing of semiconductor wafers.

BACKGROUND OF THE INVENTION

At some point in the processing of semiconductor wafers, it is common to need to etch one dielectric layer selectively relative to an underlying dielectric layer. This is typically accommodated by utilizing chemically different dielectric layers, such as an oxide and a nitride, and utilizing a wet acid or other chemistry which enables etching of the overlying material relative to the underlying material. One drawback with such techniques is that typically the two different dielectrics do not have the same thermal coefficient of expansion. This can create undesired stress in the resulting structure where remaining adjoined layers of an oxide and a nitride exist.

Silicon dioxide can be provided atop a wafer in both doped and undoped forms. Example dopants include phosphorus and boron, which can be utilized to produce phosphosilicate glass (PSG), borosilicate glass (BSG) and borophosphosilicate glass (BPSG). Such dopants can improve step coverage, diffusion barrier properties, stress reduction, and improve flow characteristics enabling dielectric flow at lower temperatures. Additionally, doped and undoped silicon dioxide has very similar thermal expansion coefficients.

It would be desirable to develop a wet etching chemistry that would enable etching of doped silicon dioxide selectively relative to undoped silicon dioxide.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
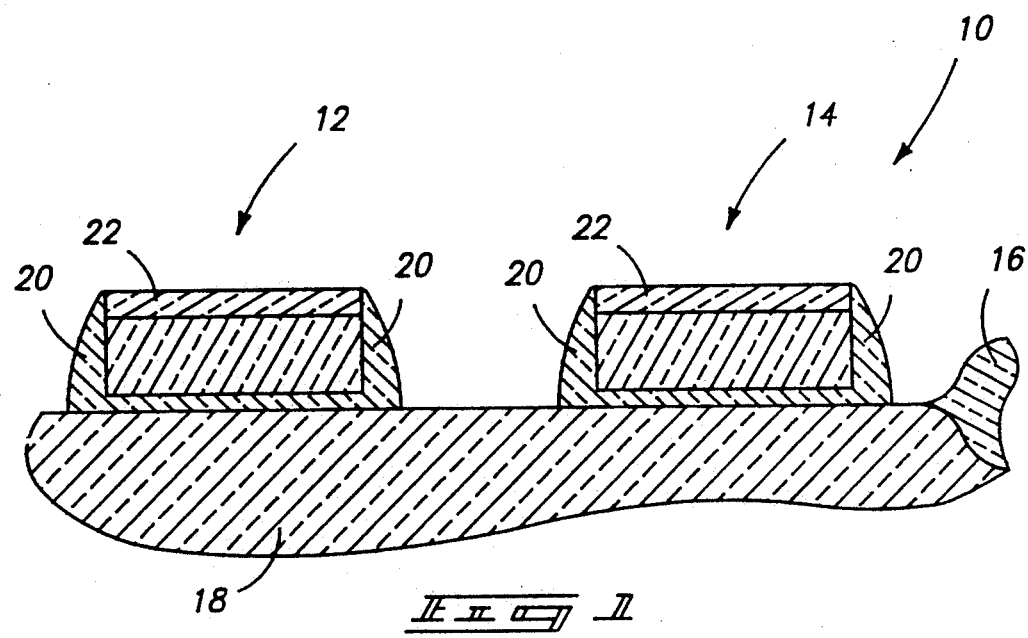
FIG. 1 is a diagrammatic section of a semiconductor wafer at a processing step in accordance with the invention.

This disclosure of the invention is submitted in furtherance of the constitutional purposes of the U.S. Patent Laws "to promote the progress of science and useful arts" (Article 1, Section 8).

In accordance with the invention, a method of utilizing and etching $SiO_2$ in the processing of semiconductor wafers comprises the following steps:

providing a layer of undoped $SiO_2$ atop a wafer;

providing a layer of doped $SiO_2$ atop the layer of undoped $SiO_2$; and wet etching the layer of doped $SiO_2$ selectively relative to the undoped layer of $SiO_2$ utilizing an acid solution, the acid solution comprising a mixture of at least two different mineral acids provided in a selected ratio relative to one another, one of the mineral acids being HF.

The undoped $SiO_2$ can be deposited or provided by any known technique. The doped $SiO_2$ can be any of borosilicate glass, phosphosilicate glass, borophosphosilicate glass, or others. The invention has been reduced to practice utilizing undoped $SiO_2$ deposited by decomposition of tetraethylorthosilicate (TEOS) followed by TEOS densification, with the doped $SiO_2$ comprising borophosphosilicate glass having six weight percent phosphorus and three weight percent boron.

It is expected that the other of the mineral acids could comprise any variety of mineral acid or combinations of mineral acids. In the context of this document, "mineral acid" has its standard definition of an inorganic acid. The invention has been reduced to practice utilizing other mineral acids of $H_2SO_4$, HCl and $HNO_3$. $HNO_3$, however, provides a disadvantage of not providing selectivity relative to silicon during the etch. Accordingly where silicon is or will be exposed by etch of the doped oxide, $HNO_3$ would typically not be an acid of choice. Example other preferred mineral acids include $H_3PO_4$, HBr, HI, $HClO_4$, and $HIO_4$, or mixtures thereof.

The preferred volumetric ratio of other mineral acids in the acid solution to HF in the acid solution is from 20:1 to 110:1, with 45:1 to 65:1 being most preferred. The invention was reduced to practice utilizing a ratio of 55:1. For ratios toward the 110:1 point, selectivity is expected to be high, while etch rate is expected to be low. At a ratios toward the 20:1 point, etch rate is expected to be high, while selectivity will be reduced.

The preferred solution temperatures for etching are expected to fall between 20° C. and 50° C., with about 35° C. being most preferred. Lower bath temperatures are expected to provide better selectivity, and a slower etch rate, while higher bath temperatures are expected to provide poorer selectivity and a higher etch rate.

An example etch solution with which the invention was reduced to practice comprised 840 ml $H_2SO_4$, 960 ml $H_2O$, 30 ml HF, and 60 ml acetic acid. The $H_2SO_4$ solution was comprised of 97% $H_2SO_4$. The HF solution comprised 49% by volume HF in $H_2O$. This thus provided in the etching solution a volumetric ratio of $H_2SO_4$:HF of 55:1. Acetic acid is a known prior art component in wet acid etching which provides bath stabilization and extends bath life. Such does not constitute a part of this invention, nor is it necessary in the invention. Bath temperature was maintained at 35° C. during etching. Such chemistry was determined to etch borophosphosilicate glass (six weight percent phosphorus, three weight percent boron) at a rate of 108 Angstroms per second, while etching densified TEOS at a rate of 17 Angstroms per second, thus providing a selectivity ratio of 6.3 to 1. Corresponding etch rates were determined utilizing HCl and $HNO_3$ in place of $H_2SO_4$.

An example implementation utilizing the above described technology is shown and described with reference to FIGS. 1–4 for formation of cell capacitor storage nodes. FIG. 1 illustrates a semiconductor wafer fragment 10 having a pair of word lines 12, 14 and a field oxide region 16 provided over a bulk substrate 18. Field oxide 16 would comprise undoped $SiO_2$. Word lines 12, 14 are as well shown surrounded by undoped $SiO_2$, provided in the form of spacers 20 and caps 22. Such would typically be deposited by decomposition of TEOS, followed by well known densification techniques.

Figure 2:
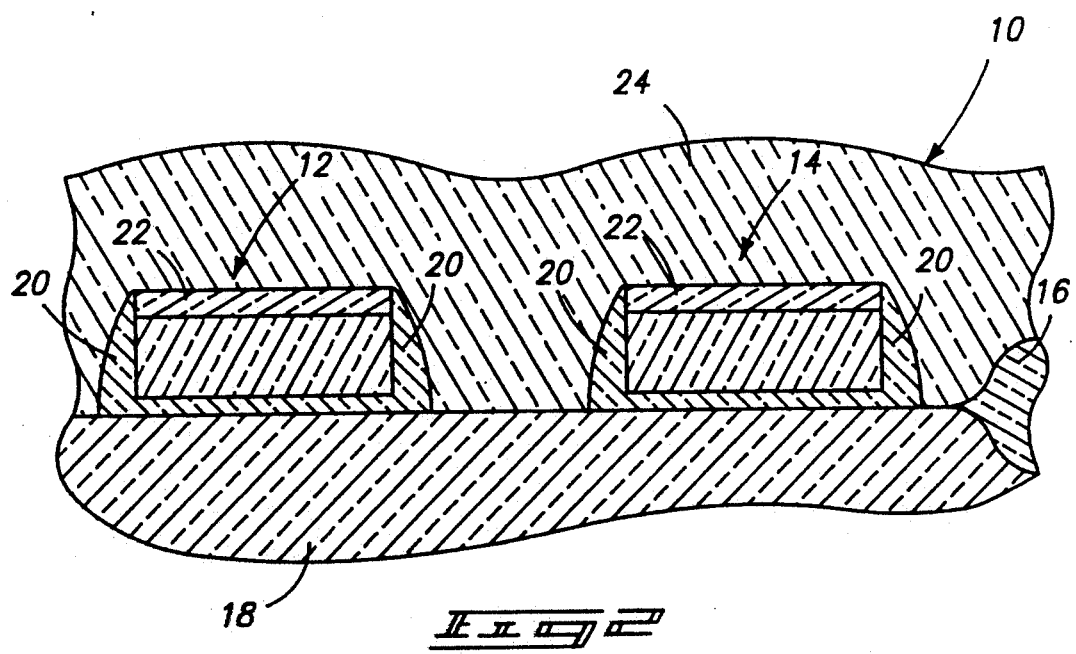
FIG. 2 is a diagrammatic section of the FIG. 1 wafer illustrated at a processing step subsequent to that shown by FIG. 1.

Referring to FIG. 2, a layer 24 of BPSG is applied.

Figure 3:
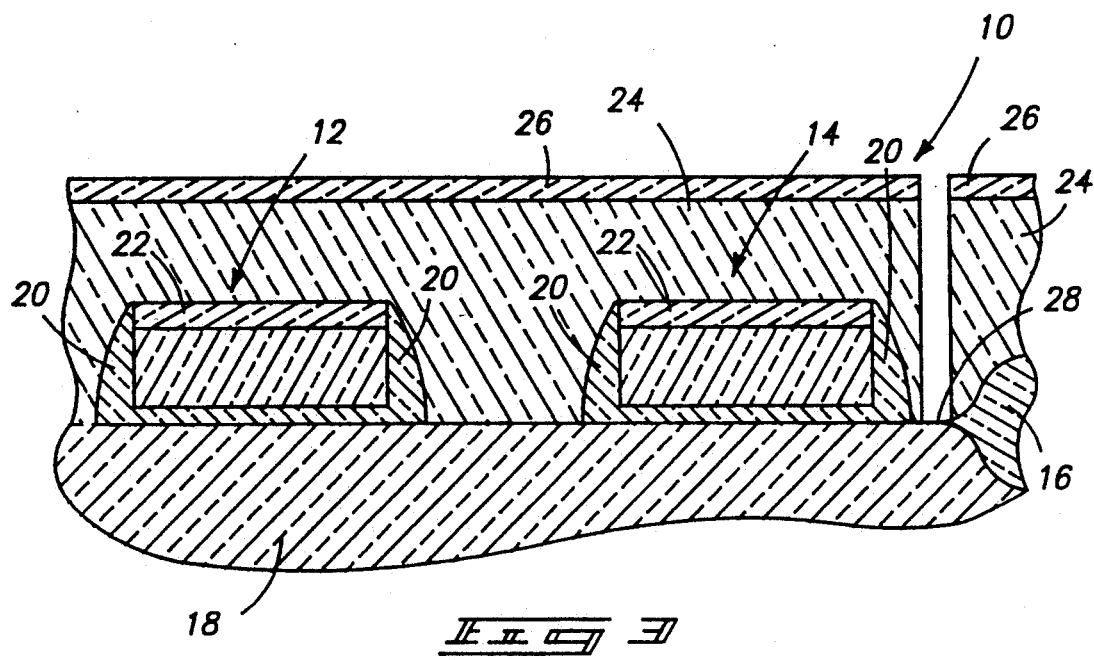
FIG. 3 is a diagrammatic section of the FIG. 1 wafer illustrated at a processing step subsequent to that shown by FIG. 2.

Referring to FIG. 3, a layer 26 of photoresist is applied, patterned and a dry etch conducted through BPSG layer 24 to open a desired capacitor contact 28 to an active area (not shown) in substrate 18.

Figure 4:
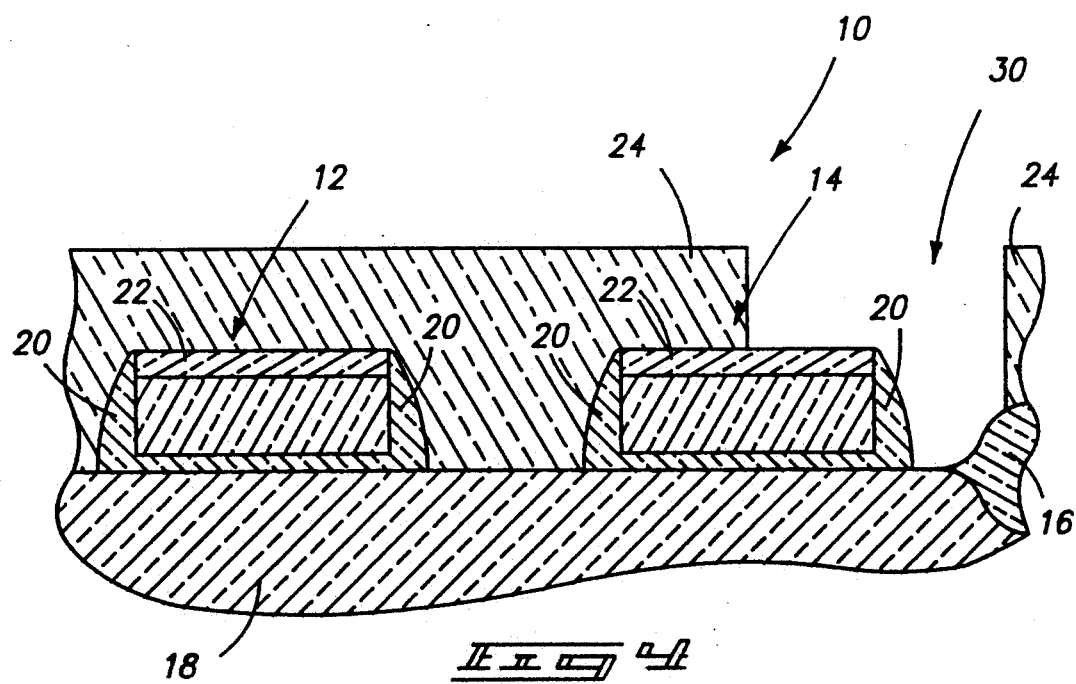
FIG. 4 is a diagrammatic section of the FIG. 1 wafer illustrated at a processing step subsequent to that shown by FIG. 3.

Referring to FIG. 4, the wafer would then be dipped in a wet acid solution in accordance with the invention, with photoresist 26 still in place, to effect an isotropic etch of the BPSG layer. Such which will be selective to the undoped TEOS $SiO_2$ and field oxide, and photoresist. Thereafter, the photoresist layer is removed, producing the FIG. 4 construction. The illustrated and enlarged cavity 30 which is produced can be utilized for a cell storage node capacitor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of utilizing and etching $SiO_2$ in the processing of semiconductor wafers, the method comprising the following steps:
   providing a layer of undoped $SiO_2$ atop a wafer;
   providing a layer of doped $SiO_2$ atop the layer of undoped $SiO_2$; and
   wet etching the layer of doped $SiO_2$ selectively relative to the undoped layer of $SiO_2$ utilizing an acid solution, the acid solution comprising a mixture of at least two different mineral acids provided in a selected ratio relative to one another, one of the mineral acids being HF, the other of the mineral acids being selected from the group consisting of $H_2SO_4$, $H_3PO_4$, HBr, HI, $HClO_4$, and $HIO_4$, or mixtures thereof.

2. The method of utilizing and etching $SiO_2$ of claim 1 wherein the volumetric ratio of other mineral acids in the acid solution to HF in the acid solution is from 20:1 to 110:1.

3. The method of utilizing and etching $SiO_2$ of claim 1 wherein the volumetric ratio of other mineral acids in the acid solution to HF in the acid solution is from 45:1 to 65:1.

4. The method of utilizing and etching $SiO_2$ of claim 1 wherein the volumetric ratio of other mineral acids in the acid solution to HF in the acid solution is about 55:1.

5. The method of utilizing and etching $SiO_2$ of claim 1 wherein the doped layer of $SiO_2$ comprises borophosphosilicate glass.

6. The method of utilizing and etching $SiO_2$ of claim 1 wherein,
   the volumetric ratio of other mineral acids in the acid solution to HF in the acid solution is from 20:1 to 110:1; and
   the doped layer of $SiO_2$ comprises borophosphosilicate glass.

7. The method of utilizing and etching $SiO_2$ of claim 1 wherein,
   the volumetric ratio of other mineral acids in the acid solution to HF in the acid solution is from 45:1 to 65:1; and
   the doped layer of $SiO_2$ comprises borophosphosilicate glass.

8. A method of utilizing and etching $SiO_2$ in the processing of semiconductor wafers, the method comprising the following steps:
   providing a layer of undoped $SiO_2$ atop a wafer;
   providing a layer of doped $SiO_2$ atop the layer of undoped $SiO_2$; and
   wet etching the layer of doped $SiO_2$ selectively relative to the undoped layer of $SiO_2$ and selectively relative to silicon utilizing an acid solution, the acid solution comprising a mixture of at least two different mineral acids provided in a selected ratio relative to one another, one of the mineral acids being HF, the other of the mineral acids being $H_2SO_4$.

9. The method of utilizing and etching $SiO_2$ of claim 8 wherein the volumetric ratio of $H_2SO_4$ in the acid solution to HF in the acid solution is from 20:1 to 110:1.

10. The method of utilizing and etching $SiO_2$ of claim 8 wherein the volumetric ratio of $H_2SO_4$ in the acid solution to HF in the acid solution is from 45:1 to 65:1.

11. The method of utilizing and etching $SiO_2$ of claim 8 wherein the volumetric ratio of $H_2SO_4$ in the acid solution to HF in the acid solution is about 55:1.

12. The method of utilizing and etching $SiO_2$ of claim 8 wherein the doped layer of $SiO_2$ comprises borophosphosilicate glass.

13. The method of utilizing and etching $SiO_2$ of claim 8 wherein,
   the volumetric ratio of $H_2SO_4$ in the acid solution to HF in the acid solution is from 20:1 to 110:1; and
   the doped layer of $SiO_2$ comprises borophosphosilicate glass.

14. The method of utilizing and etching $SiO_2$ of claim 8 wherein,
   the volumetric ratio of $H_2SO_4$ in the acid solution of HF in the acid solution is from 45:1 to 65:1; and
   the doped layer of $SiO_2$ comprises borophosphosilicate glass.

15. The method of utilizing and etching $SiO_2$ of claim 1 wherein the acid solution consists essentially of HF and $H_2SO_4$.

16. The method of utilizing and etching $SiO_2$ of claim 1 wherein the acid solution consists essentially of HF and $H_3PO_4$.

17. The method of utilizing and etching $SiO_2$ of claim 1 wherein the acid solution consists essentially of HF and HBr.

18. The method of utilizing and etching $SiO_2$ of claim 1 wherein the acid solution consists essentially of HF and HI.

19. The method of utilizing and etching $SiO_2$ of claim 1 wherein the acid solution consists essentially of HF and $HClO_4$.

20. The method of utilizing and etching $SiO_2$ of claim 1 wherein the acid solution consists essentially of HF and $HIO_4$.

* * * * *